United States Patent
Ju et al.

(10) Patent No.: US 6,245,623 B1
(45) Date of Patent: *Jun. 12, 2001

(54) CMOS SEMICONDUCTOR DEVICE CONTAINING N-CHANNEL TRANSISTOR HAVING SHALLOW LDD JUNCTIONS

(75) Inventors: Dong-Hyuk Ju, Cupertino; Emi Ishida, Sunnyvale, both of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/187,431

(22) Filed: Nov. 6, 1998

(51) Int. Cl.[7] ................................................. H01L 21/8236
(52) U.S. Cl. ............................................................. 438/305
(58) Field of Search .................................... 438/306, 297, 438/302, 231, 335, 305

(56) References Cited

U.S. PATENT DOCUMENTS

| | | | |
|---|---|---|---|
| 5,646,430 | * | 7/1997 | Kaya et al. . |
| 5,719,425 | * | 2/1998 | Akram et al. . |
| 5,866,460 | * | 2/1999 | Akram et al. . |
| 5,972,760 | * | 10/1999 | Ju ................................ 438/305 |
| 5,998,248 | * | 1/1999 | Ma et al. . |
| 5,998,274 | * | 12/1999 | Akram et al. . |
| 6,008,098 | * | 12/1999 | Pramanick et al. . |
| 6,017,797 | * | 1/2000 | Furukawa . |
| 6,022,771 | * | 1/1999 | Ma et al. . |
| 6,025,242 | * | 1/1999 | Ma et al. . |
| 6,027,974 | * | 2/2000 | Liu et al. . |
| 6,027,975 | * | 8/1998 | Hergenrther et al. . |

OTHER PUBLICATIONS

Ghandhi, "VLSI Fabrication Principles: Silicon and Gallium Arsnide," pp. 426–427, 1994.*

Wolf et al, "Silicon Processing for the VLSI Era," vol. 1, pp. 323–325, 1986.*

* cited by examiner

Primary Examiner—Richard Booth

(57) ABSTRACT

A CMOS semiconductor device having shallow source/drain junctions is formed by ion implanting antimony to form lightly doped source/drain regions of an N-channel transistor, thereby reducing channeling for a shallower projected junction depth as compared to conventional N-type impurity implantations. Upon growing a thermal oxide screen layer to protect the substrate from subsequent ion implantations, the implanted antimony experiences oxidation-retarded diffusion, further reducing the projected junction depth. After ion implanting N-type impurities to form moderately or heavily doped source/drain regions and activation annealing, the resulting semiconductor device exhibits the desirably shallow LDD junctions.

12 Claims, 3 Drawing Sheets

CMOS SEMICONDUCTOR DEVICE CONTAINING N-CHANNEL TRANSISTOR HAVING SHALLOW LDD JUNCTIONS

FIELD OF THE INVENTION

The present invention relates to a semiconductor device and a method of manufacturing high density semiconductor devices having shallow lightly-doped junctions. The present invention has particular applicability in manufacturing high density semiconductor devices with design features of 0.25 microns and under.

BACKGROUND ART

The escalating requirements for high density and performance associated with ultra large scale integration semiconductor devices require design features of 0.25 microns and under, such as under 0.18 microns, increased transistor and circuit speeds, high reliability and increased manufacturing throughput. The reduction of design features to 0.25 microns and under challenges the limitations of conventional semiconductor methodology.

Conventional semiconductor devices typically comprise a semiconductor substrate, normally doped monocrystalline silicon, and a plurality of interlayered dielectric and conductive layers formed thereon. In a conventional semiconductor device 100 illustrated in FIG. 1, p-type substrate 1 is provided with field oxide 2 for isolating an active region comprising N+source/drain regions 3, and a gate electrode 4, typically of doped polysilicon, above the semiconductor substrate with gate oxide 5 therebetween. Interlayer dielectric layer 6, typically silicon dioxide, is then deposited thereover and openings formed by conventional photolithographic and etching techniques. The openings are filled with conductive material to establish electrical contact between subsequently deposited conductive layer 8, typically aluminum or an aluminum-base alloy, and source/drain regions 3 through contacts 7, and to transistor gate electrode 49. Dielectric layer 9, typically silicon dioxide, is deposited on conductive layer 8, and another conductive layer 10, typically aluminum or an aluminum-base alloy, formed on dielectric layer 9 and electrically connected to conductive layer 8 through vias 11.

With continued reference to FIG. 1, conductive layer 10 is the uppermost conductive layer and, hence, constitutes the wire bonding layer. Dielectric layer 12, also typically silicon dioxide, is deposited, and a protective dielectric scratch resistant topside layer 13 deposited thereon. Protective dielectric layer 13 typically comprises a nitride layer, such as silicon nitride ($Si_3N_4$). Alternatively, protective dielectric layer 13 may comprise a dual topcoat comprising a nitride layer on an oxide layer. The protective dielectric layer 13 provides scratch protection to the semiconductor device and protection against moisture and impurity contamination during subsequent processing. After deposition of protective dielectric layer 13, conventional photolithographic etching techniques are employed to form an opening to expose wire bonding layer 10 for external connection by means of bonding pad 14 and electrically conductive wires 15 or an external connection electrode (not shown).

Although only two conductive layers 8 and 10 are depicted in FIG. 1 for illustrative convenience, conventional semiconductor devices are not so limited and may comprise more than two conductive layers, depending on design requirements, e.g. five conductive metal layers. Also in the interest of illustrative convenience, FIG. 1 does not illustrate any particular type of plug or barrier layer technology. However, such technology is conventional and, therefore, the details of such features are not set forth herein.

As device features continually shrink in size, it becomes necessary to decrease the depth of the source and drain regions in the semiconductor substrate, i.e., the junction depth. For example, in forming a polycrystalline silicon gate having a length of about 0.25 microns, the junction depth ($X_j$) should be no greater than about 800 Å. This objective is extremely difficult to achieve, particularly when implanting impurities to form N-type source/drain regions.

For example, in accordance with conventional methodology for forming N-channel transistors illustrated in FIG. 2, an N-type impurity such as arsenic is ion implanted, indicated by arrows 20, into semiconductor substrate 1 at a minimal implantation energy, e.g., about 10–20 KeV, selected to achieve a shallow $X_j$. Such implanted impurities form the lightly-doped drain (LDD) regions 22 upon subsequent activation annealing.

After such lightly-doped implants, a dielectric layer such as silicon oxide or silicon nitride, is deposited and etched to form insulating sidewall spacers 24 on the side surfaces of gate electrode 4. In forming sidewall spacers 24, gate oxide layer 5 is etched, thereby exposing the surface of semiconductor substrate 1 adjacent sidewall spacers 24, as shown in FIG. 2.

Adverting to FIG. 3, a thin screen oxide layer 30 is then thermally grown on the exposed surface of semiconductor substrate 1 and gate electrode 4 to reduce damage to substrate 1 during subsequent impurity implantation. N-type impurities, such as arsenic, are then ion implanted, as indicated by arrows 32 in FIG. 3, into substrate 1 to form the moderately-doped source/drain (MDD) or heavily-doped source/drain (HDD) implant regions 34. Activation annealing is then conducted to activate LDD regions 22 and MDD/HDD regions 34. Annealing is typically performed at a temperature of about 900° C. to about 1100° C. to activate the impurity implanted regions, thereby forming the source/drain regions of the N-channel transistor.

It has been found, however, that during annealing to activate the implanted dopants, arsenic diffuses into the crystalline semiconductor substrate 1 such that the junction depth exceeds the targeted maximum depth of about 800 Å. The causes of undefined dopant $X_j$ is believed to stem from various factors.

One cause for the increased $X_j$ is that arsenic, as well as other impurities typically used as dopants, exhibit oxidation-enhanced diffusion. That is, during processing steps employing oxidation, the diffusion of arsenic into the semiconductor substrate is enhanced, thereby significantly increasing $X_j$. For example, growing thermal oxide screen layer 30 after the LDD implant regions are formed, results in an increased $X_j$.

Additionally, growing thermal oxide screen layer 30 at a high temperature induces crystalline defects in substrate 1. The implanted arsenic diffuse via the crystalline defects, such as interstitials. Accordingly, the diffusion of the arsenic, as measured by the junction depth, substantially increases $X_j$ beyond the targeted maximum as a result of the thermal oxidation processes used in conventional semiconductor processing.

The subsequent high temperature dopant activation anneal, also adds to the increased $X_j$ by inducing additional crystalline defects in the underlying semiconductor substrate. The implanted arsenic diffuses further via the crystalline defects, such that the junction depth of the arsenic greatly exceeds the targeted maximum depth of about 800 Å.

Consequently the resulting dopant profile of arsenic, after the activation anneal, extends to about 1000 Å or more, which is considerably beyond the targeted maximum of about 800 Å. An undesirably deep $X_j$ causes the short channel effect, generating a leakage current, which degrades the performance of the semiconductor device.

Accordingly, there exists a need for a semiconductor device and a method of manufacturing a semiconductor device having shallow junction depths.

SUMMARY OF THE INVENTION

An object of the present invention is a method of manufacturing a semiconductor device having shallow junction depths.

Another object of the present invention is a semiconductor device having shallow junction depths.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device comprising an N-channel transistor. The method includes forming a dielectric layer on an upper surface of a semiconductor substrate and forming a conductive layer on the dielectric layer. The method also includes patterning the conductive layer to form a gate electrode of the N-channel transistor with the gate electrode having an upper surface and side surfaces. The method further includes implanting antimony, using the gate electrode as a mask, to form lightly doped implants in the semiconductor substrate.

Another aspect of the present invention is a semiconductor device including a semiconductor substrate comprising monocrystalline silicon. The semiconductor device also includes a dielectric layer formed on the semiconductor substrate and a gate electrode comprising doped polysilicon having an upper surface and side surfaces formed on the dielectric layer. The semiconductor device further includes a lightly doped source/drain region comprising antimony.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF ILLUSTRATED EMBODIMENTS

Figure 1:
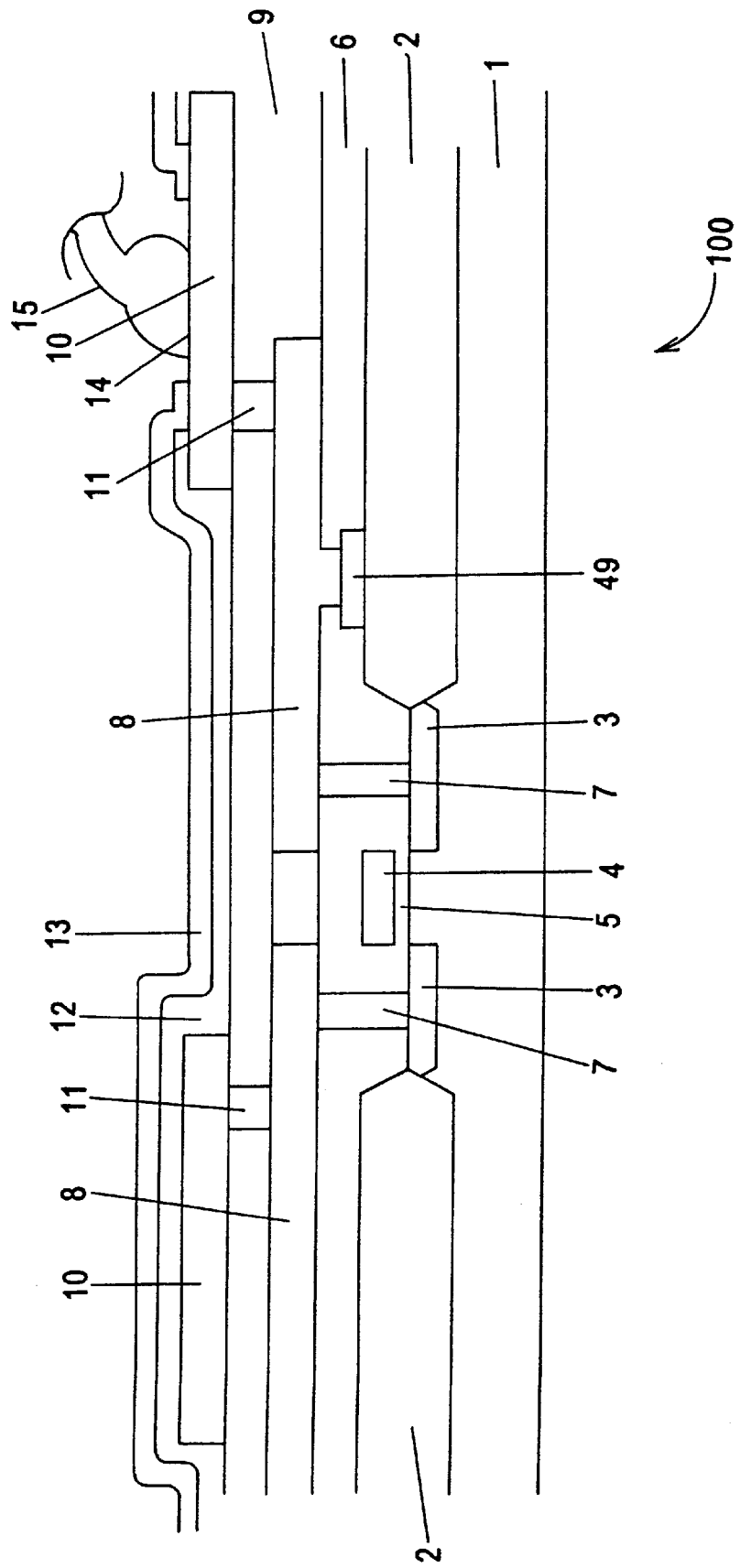
FIG. 1 schematically illustrates the cross-section of a conventional semiconductor device.
Figure 2:
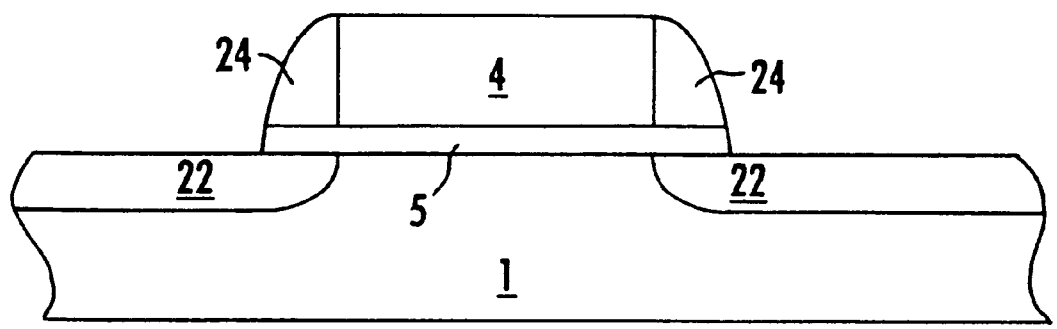
FIG. 2 illustrates the formation of sidewall spacers and LDD implant regions according to conventional methodology.
Figure 3:
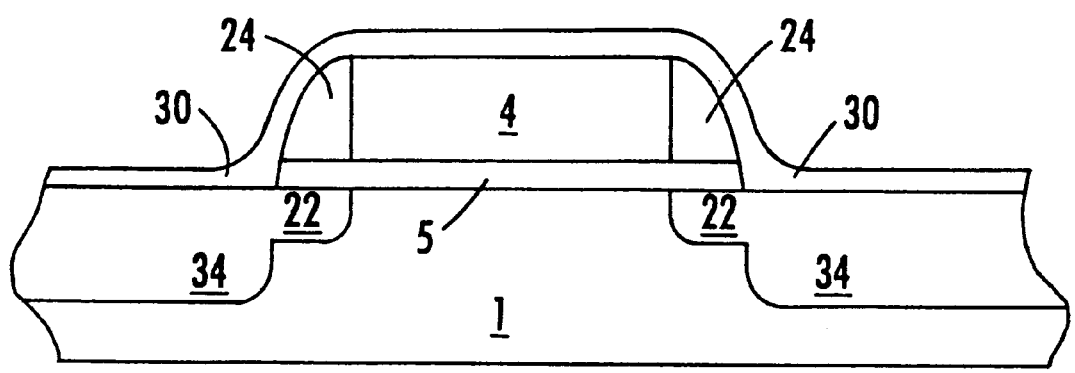
FIG. 3 illustrates the formation of MDD/HDD implant regions according to conventional methodology.

The present invention addresses and solves the problems associated with implanted impurities diffusing beyond the targeted $X_j$, thereby enabling the formation of very shallow lightly-doped source/drain (LDD) junctions. As discussed above, in accordance with conventional methodology for forming and activating LDD and MDD/HDD regions, oxidation-enhanced diffusion of implanted impurities, such as arsenic, increases $X_j$ beyond the targeted maximum junction depth of about 800 Å. Additional high temperature processes induce crystalline defects further increasing $X_j$ beyond the targeted maximum junction depth.

The present invention solves the problems associated with an undesirably deep $X_j$, by implanting antimony to form the LDD regions. In an embodiment of the present invention illustrated in FIG. 4, an initial gate dielectric layer 5, such as silicon oxide, is formed on semiconductor substrate 1 comprising monocrystalline silicon. A gate electrode layer, such as polycrystalline silicon, is deposited and etched in a conventional manner to form gate electrode 4.

The present invention departs from such conventional methodology by implanting antimony into semiconductor substrate 1 to form LDD regions. Using gate electrode 4 as a mask, antimony is ion implanted, as indicated by arrows 40 in FIG. 4, at a relatively low energy. For example, antimony may be implanted at an implantation dosage of about $5 \times 10^{14}$ atoms/cm$^2$ to about $2 \times 10^{15}$ atoms/cm$^2$ and an implantation energy of about 20 KeV to about 30 KeV to form LDD implants 42 of an N-channel MOSFET. The actual implantation dosage and implantation energy are selected for optimum N-channel transistor performance based on the particular design requirements, notably achieving an optimal $X_j$ of less than about 800 Å, e.g., about 600 Å.

Advantageously, the larger size and weight of antimony ions as compared to conventionally used arsenic or phosphorous ions, allow the antimony ions to be implanted to a shallow projected depth, due to in part by the reduced channeling of the antimony ions. That is, the larger size and weight of antimony ions implanted at a relatively high dosage leads to an increased amorphization of the crystalline structure of semiconductor substrate 1. Accordingly, channeling of the antimony into substrate 1 is reduced due to the destroyed crystalline structure of the silicon at or near the surface of semiconductor substrate 1. This reduces the projected range of antimony ions, thereby achieving a desirably shallow $X_j$.

Figure 4:
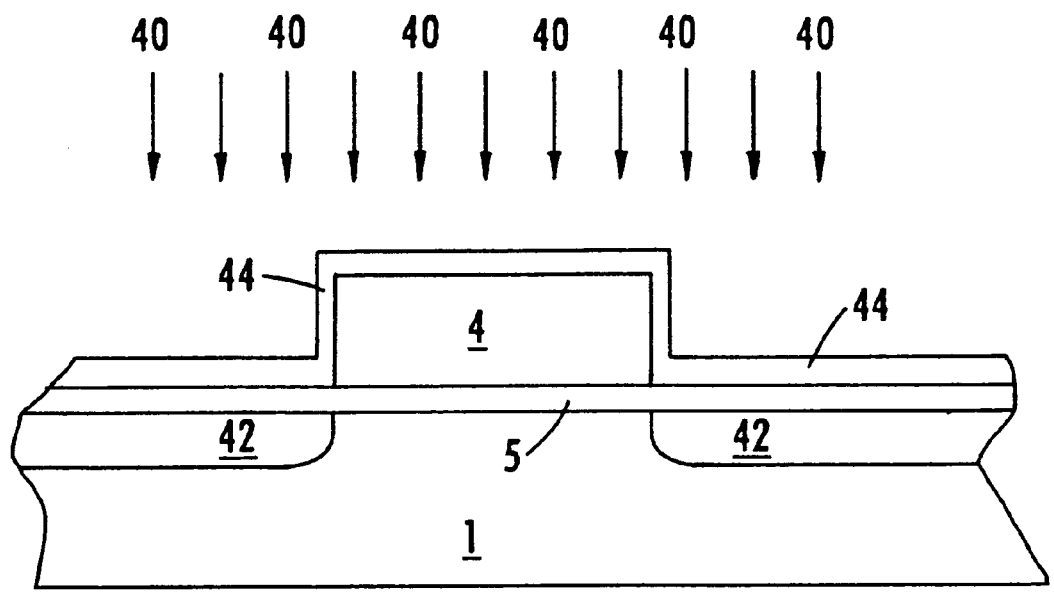
FIG. 4 illustrates the formation of LDD implant regions according to an embodiment of the present invention.

Adverting to FIG. 4, in accordance with an embodiment of the present invention, a thin silicon dioxide screen layer 44 is thermally grown on the exposed surface of semiconductor substrate 1 and on gate electrode 4. Thermal oxide screen layer 44 reduces damage to silicon substrate 1 during moderate or heavy impurity implantation. Thermal oxide screen layer 44 is typically grown in an oxygen or H$_2$O atmosphere at a temperature of about 800° C. to about 900° C. It was found that during the thermal oxidation, the implanted antimony ions experience oxidation-retarded diffusion. That is, during the oxidation to grow thermal oxide screen layer 44, the diffusivity of the antimony ions, as measured by $X_j$, decreases. Advantageously, this oxidation-retarded diffusion decreases the projected junction depth of antimony implanted LDD regions 42. The resulting $X_j$ after the thermal oxidation is significantly shallower for antimony implanted LDD regions 42 than for other conventional impurities used to form LDD regions, such as arsenic, which undergo oxidation-enhanced diffusion.

Figure 5:
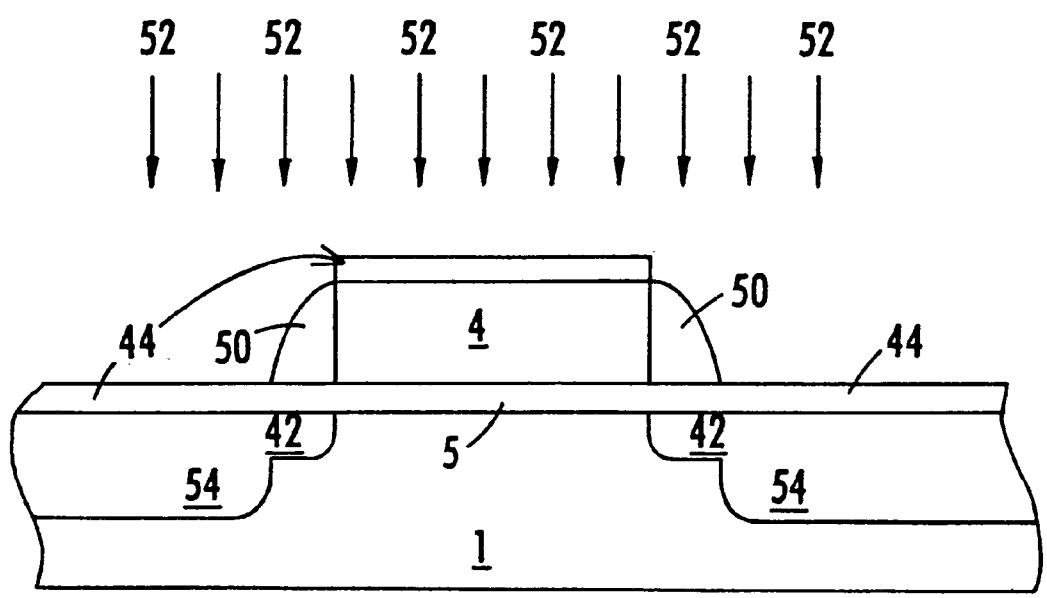
FIG. 5 illustrates the formation of sidewall spacers and MDD/HDD regions for the semiconductor device of FIG. 4.

Subsequent to growing thermal oxide screen layer 44, a layer of insulating material, such as a silicon oxide, a silicon nitride or a silicon oxynitride is deposited and etched to form sidewall spacers 50, as shown in FIG. 5, on the side surfaces of gate electrode 4 and on the portion of gate oxide layer 5 adjacent gate electrode 4.

Adverting to FIG. 5, after sidewall spacers 50 are formed, ion implantation is conducted, as indicated by arrows 52, to form the MDD/HDD implants 54. An activation anneal is then conducted to activate LDD regions 42 and MDD/HDD regions 54. Annealing is typically performed at a temperature of about 1000° C. to about 1100° C. to activate the impurity implanted regions, thereby forming the source/drain regions of an N-channel MOSFET. As a result, LDD regions 42 exhibit an extremely shallow and desirable $X_j$ of less than about 800Å, e.g., about 600Å.

In another -embodiment of the invention, thermal oxide screen layer 44 can be grown after formation of sidewall spacers 50. In this manner, the oxidation-retarded diffusion experienced during the thermal oxidation enables the antimony to advantageously attain a shallow junction depth, in a similar manner as discussed above.

The present invention enables semiconductor devices to be formed with extremely shallow and desirable junction depths of less than about 800Å, thereby avoiding narrow channel effect and consequential junction leakage with an adverse impact on device reliability. In addition, the present invention is cost-effective and can be easily integrated into conventional processing.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

The dielectric and conductive layers utilized in manufacturing a semiconductor device in accordance with the present invention can be deposited by conventional deposition techniques. For example, dielectric deposition techniques such as various types of chemical vapor deposition (CVD) processes, including low pressure chemical vapor deposition (LPCVD) and plasma-enhanced chemical vapor deposition (PECVD) can be employed.

The present invention enjoys applicability in the manufacturing of semiconductor devices, particularly high density, multi-metal layer semiconductor devices, with submicron features of 0.25 microns and below, exhibiting high speed characteristics and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device comprising an N-channel transistor, which method comprises:

forming a dielectric layer on an upper surface of a semiconductor substrate;

forming a conductive layer on the dielectric layer;

patterning the conductive layer to form a gate electrode of the N-channel transistor, the gate electrode having an upper surface and side surfaces;

implanting antimony, using the gate electrode as a mask, to form lightly doped implants in the semiconductor substrate; and growing a thermal oxide screen layer by thermal oxidation after the antimony is implanted.

2. The method according to claim 1, comprising:

depositing an insulating layer; and etching the insulating layer to form sidewall spacers on the side surfaces of the gate electrode.

3. The method of claim 2 comprising:

implanting impurities to form moderately or heavily doped implants in the semiconductor substrate.

4. The method according to claim 3, comprising activation annealing at a temperature of about 1000° C. to about 1100° C. to activate the impurity implanted regions forming source/drain regions of the N-channel transistor.

5. The method according to claim 4, wherein the activated source/drain regions extend into the semiconductor substrate to a lightly doped junction depth less than about 800 Å.

6. The method according to claim 1, comprising implanting antimony at an implantation dosage of about $5\times10^{14}$ atoms/cm$^2$ to about $2\times10^{15}$ atoms/cm$^2$ and an implantation energy of about 20 KeV to about 30 KeV to form the lightly doped implants.

7. The method according to claim 3, comprising implanting N-type impurities at an implantation dosage of about $2\times10^{15}$ atoms/cm$^2$ to about $5\times10^{15}$ atoms/cm$^2$ and an implantation energy of about 30 KeV to about 40 KeV to form the moderately or heavily doped implants.

8. The method according to claim 1, wherein the dielectric layer comprises a silicon oxide and the substrate comprises doped monocrystalline silicon.

9. The method according to claim 8, wherein the gate electrode comprises doped polycrystalline silicon.

10. The method according to claim 1, wherein the semiconductor device is a CMOS semiconductor and the thermal oxide screen layer is grown on the semiconductor substrate and the gate electrode.

11. The method of claim 10, comprising:

depositing an insulating layer;

etching the insulating layer to form sidewall spacers on the side surfaces of the gate electrode and on a portion of the dielectric layer adjacent the side surface;

implanting N-type impurities, using the gate electrode and sidewall spacers as a mask, to form moderately or heavily doped implant regions in the semiconductor substrate; and annealing to activate the implanted impurity regions forming source/drain regions.

12. The method of claim 11, wherein the N-type impurities comprise arsenic or phosphorous.

* * * * *